(12) United States Patent
Dorf et al.

(10) Patent No.: US 11,069,504 B2
(45) Date of Patent: Jul. 20, 2021

(54) CREATING ION ENERGY DISTRIBUTION FUNCTIONS (IEDF)

(71) Applicant: APPLIED MATERIALS, INC., Santa Clara, CA (US)

(72) Inventors: Leonid Dorf, San Jose, CA (US); Travis Koh, Sunnyvale, CA (US); Olivier Luere, Sunnyvale, CA (US); Olivier Joubert, Meylan (FR); Philip A. Kraus, San Jose, CA (US); Rajinder Dhindsa, Pleasanton, CA (US); James Rogers, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/867,034

(22) Filed: May 5, 2020

(65) Prior Publication Data
US 2020/0266022 A1      Aug. 20, 2020

Related U.S. Application Data

(63) Continuation of application No. 16/405,377, filed on May 7, 2019, now Pat. No. 10,685,807, which is a
(Continued)

(51) Int. Cl.
*H01J 37/08* (2006.01)
*H01J 37/32* (2006.01)
*H01J 37/248* (2006.01)

(52) U.S. Cl.
CPC ............ *H01J 37/08* (2013.01); *H01J 37/248* (2013.01); *H01J 37/32577* (2013.01); *H01J 37/32706* (2013.01); *H01J 37/32715* (2013.01)

(58) Field of Classification Search
CPC ........... H01J 37/32009; H01J 37/32174; H01J 37/32935; H01J 37/3299; H01J 37/32082;
(Continued)

(56) References Cited

U.S. PATENT DOCUMENTS

| 6,201,208 B1 * | 3/2001 | Wendt | B23K 10/003 |
| | | | 219/121.41 |
| 6,544,895 B1 * | 4/2003 | Donohoe | H01J 37/32009 |
| | | | 438/706 |

(Continued)

FOREIGN PATENT DOCUMENTS

KR     10-2015-0032638 A     3/2015

OTHER PUBLICATIONS

International Search Report and Written Opinion dated Mar. 30, 2018 for PCT Application No. PCT/US 2017/065546.

*Primary Examiner* — David A Vanore
(74) *Attorney, Agent, or Firm* — Moser Taboada (57) ABSTRACT

Systems and methods for creating arbitrarily-shaped ion energy distribution functions using shaped-pulse—bias. In an embodiment, a method includes applying a positive jump voltage to an electrode of a process chamber to neutralize a wafer surface, applying a negative jump voltage to the electrode to set a wafer voltage, and modulating the amplitude of the wafer voltage to produce a predetermined number of pulses to determine an ion energy distribution function. In another embodiment a method includes applying a positive jump voltage to an electrode of a process chamber to neutralize a wafer surface, applying a negative jump voltage to the electrode to set a wafer voltage, and applying a ramp voltage to the electrode that overcompensates for ion current on the wafer or applying a ramp voltage to the electrode that undercompensates for ion current on the wafer.

21 Claims, 10 Drawing Sheets

Related U.S. Application Data continuation of application No. 15/834,939, filed on Dec. 7, 2017, now Pat. No. 10,312,048.

(60) Provisional application No. 62/433,204, filed on Dec. 12, 2016.

(58) Field of Classification Search
CPC .... H01J 37/32091; H01J 37/08; H01J 37/241; H01J 37/32146; H01J 37/24; H01J 37/248; H01J 37/32045; H01J 37/321; H01J 37/32137; H01J 37/32412; H01J 37/32623; H01J 37/32706; H01J 37/32944; C23C 14/54; C23C 14/345; C23C 14/48; C23C 16/50
USPC .................. 219/121.41, 121.43; 250/492.21; 438/706, 710, 712, 714, 720
See application file for complete search history.

(56) References Cited

U.S. PATENT DOCUMENTS

| | | | |
|---|---|---|---|
| 8,140,292 B2* | 3/2012 | Wendt | H01J 37/32137 |
| | | | 702/124 |
| 9,105,447 B2* | 8/2015 | Brouk | H01J 37/241 |
| 9,208,902 B2 | 12/2015 | Brook et al. | |
| 9,208,992 B2* | 12/2015 | Brouk | H01J 37/32174 |
| 9,210,790 B2 | 12/2015 | Hoffman et al. | |
| 9,287,086 B2 | 3/2016 | Brouk et al. | |
| 9,287,092 B2* | 3/2016 | Brouk | H01J 37/3299 |
| 9,309,594 B2 | 4/2016 | Hoffman et al. | |
| 9,362,089 B2* | 6/2016 | Brouk | H01J 37/32009 |
| 9,685,297 B2* | 6/2017 | Carter | G01N 27/06 |
| 9,767,988 B2* | 9/2017 | Brouk | H01J 37/3299 |
| 9,887,069 B2* | 2/2018 | Fischer | H01J 37/32091 |
| 10,312,048 B2 | 6/2019 | Dorf | |
| 2006/0088655 A1* | 4/2006 | Collins | C23C 14/48 |
| | | | 427/8 |
| 2008/0032427 A1 | 2/2008 | Lee et al. | |
| 2012/0052599 A1 | 3/2012 | Brouk et al. | |
| 2015/0144596 A1 | 5/2015 | Brouk et al. | |
| 2016/0020072 A1 | 1/2016 | Brouk et al. | |
| 2016/0163514 A1 | 6/2016 | Fisk, II et al. | |
| 2017/0062186 A1 | 3/2017 | Coumou et al. | |
| 2017/0250056 A1 | 8/2017 | Boswell et al. | |
| 2017/0278665 A1 | 9/2017 | Carter et al. | |
| 2017/0358431 A1 | 12/2017 | Dorf | |
| 2018/0005802 A1 | 1/2018 | Chen et al. | |
| 2018/0019100 A1 | 1/2018 | Brouk et al. | |
| 2018/0166249 A1* | 6/2018 | Dorf | H01J 37/248 |
| 2020/0020510 A1 | 1/2020 | Shoeb et al. | |

* cited by examiner

MONO-ENERGETIC IEDF

CREATING ION ENERGY DISTRIBUTION FUNCTIONS (IEDF)

CROSS-REFERENCE TO RELATED APPLICATIONS

This application is a continuation of and claims the benefit of U.S. patent application Ser. No. 16/405,377, filed May 7, 2019, which is a continuation of U.S. patent application Ser. No. 15/834,939, filed Dec. 7, 2017, which claims the benefit of U.S. Provisional Patent Application Ser. No. 62/433,204, filed Dec. 12, 2016, all of which are incorporated herein by this reference in their entireties.

FIELD

Embodiments of the present disclosure generally relate to systems and methods for processing a substrate and, particularly, to systems and methods for plasma processing of substrates.

BACKGROUND

Figure 1A:
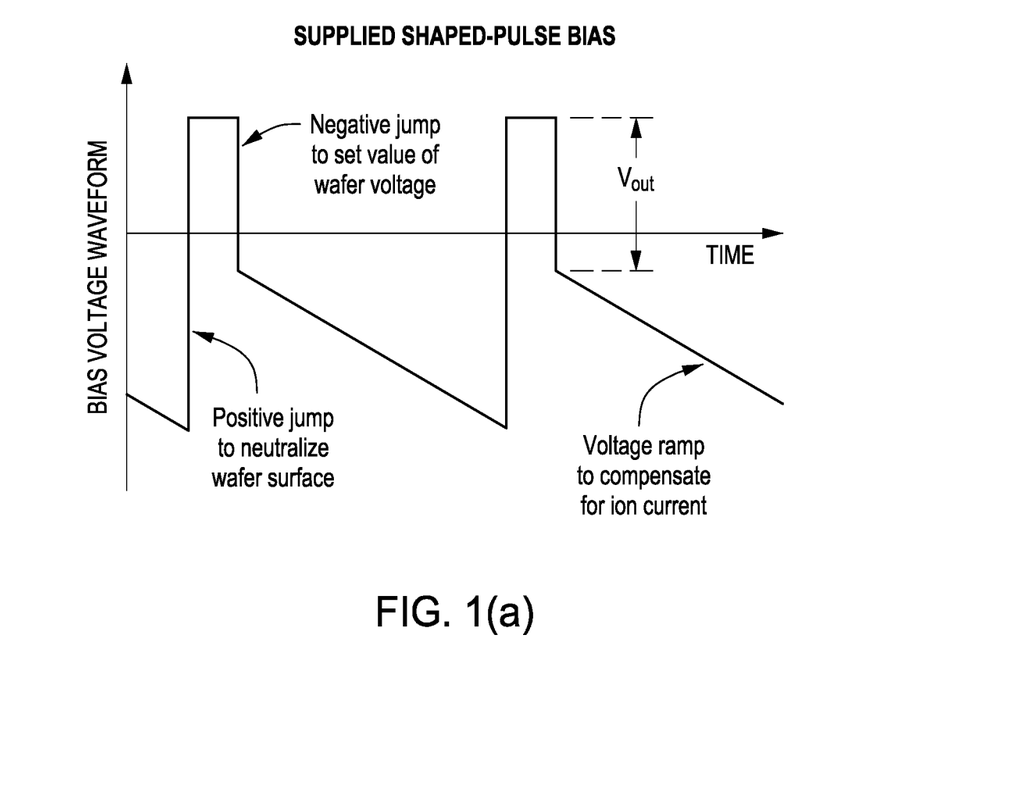
FIG. 1(a) depicts a plot of a special shaped-pulse developed to enable keeping the sheath voltage constant.

A typical Reactive Ion Etch (RIE) plasma processing chamber includes a radiofrequency (RF) bias generator which supplies an RF voltage to a "power electrode", a metal baseplate embedded into the "electrostatic chuck" (ESC), more commonly referred to as the "cathode". FIG. 1(a) depicts a plot of a typical RF voltage to be supplied to a power electrode in a typical processing chamber. The power electrode is capacitively coupled to the plasma of a processing system through a layer of ceramic, which is a part of the ESC assembly. Non-linear, diode-like nature of the plasma sheath results in rectification of the applied RF field, such that a direct-current (DC) voltage drop, or "self-bias", appears between the cathode and the plasma. This voltage drop determines the average energy of the plasma ions accelerated towards the cathode, and thus the etch anisotropy.

More specifically, ion directionality, the feature profile, and selectivity to the mask and the stop-layer are controlled by the Ion Energy Distribution Function (IEDF). In plasmas with RF bias, the IEDF typically has two peaks, at low and high energy, and some ion population in between. The presence of the ion population in between the two peaks of the IEDF is reflective of the fact that the voltage drop between the cathode and the plasma oscillates at the bias frequency. When a lower frequency, for example 2 MHz, RF bias generator is used to get higher self-bias voltages, the difference in energy between these two peaks can be significant and the etch due to the ions at low energy peak is more isotropic, potentially leading to bowing of the feature walls. Compared to the high-energy ions, the low-energy ions are less effective at reaching the corners at the bottom of the feature (due to charging effect, for example), but cause less sputtering of the mask material. This is important in high aspect ratio etch applications, such as hard-mask opening.

Figure 1B:
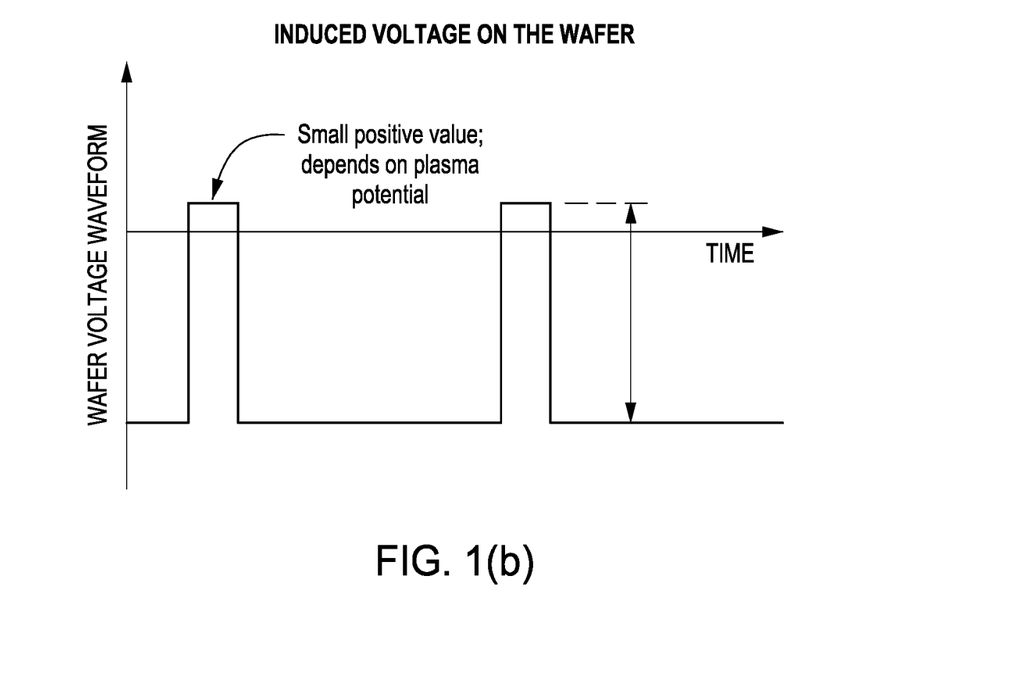
FIG. 1(b) depicts a plot of a specific substrate voltage waveform resulting from the biasing scheme of FIG. 1(a) which allows the sheath voltage and the substrate voltage to remain constant for up to 90% of each bias voltage cycle.
Figure 1C:
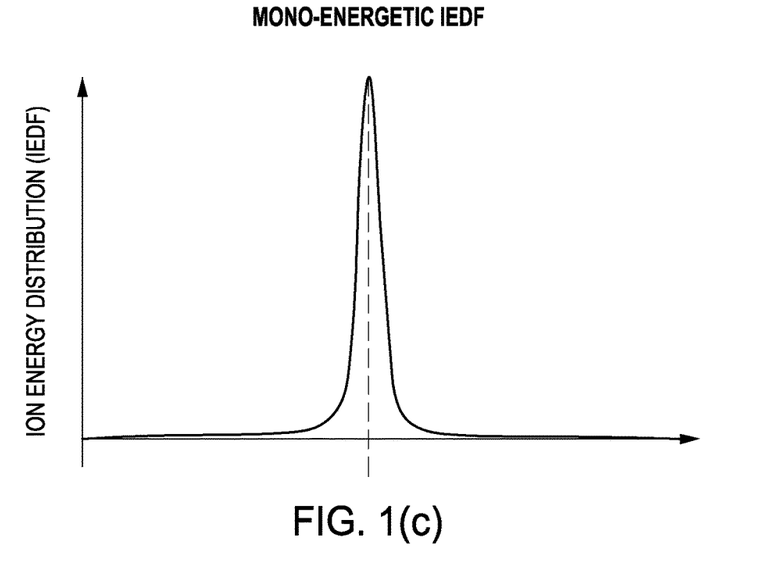
FIG. 1(c) depicts a plot of a single-peak IEDF resulting from the biasing scheme of FIG. 1(a).
Figure 2:
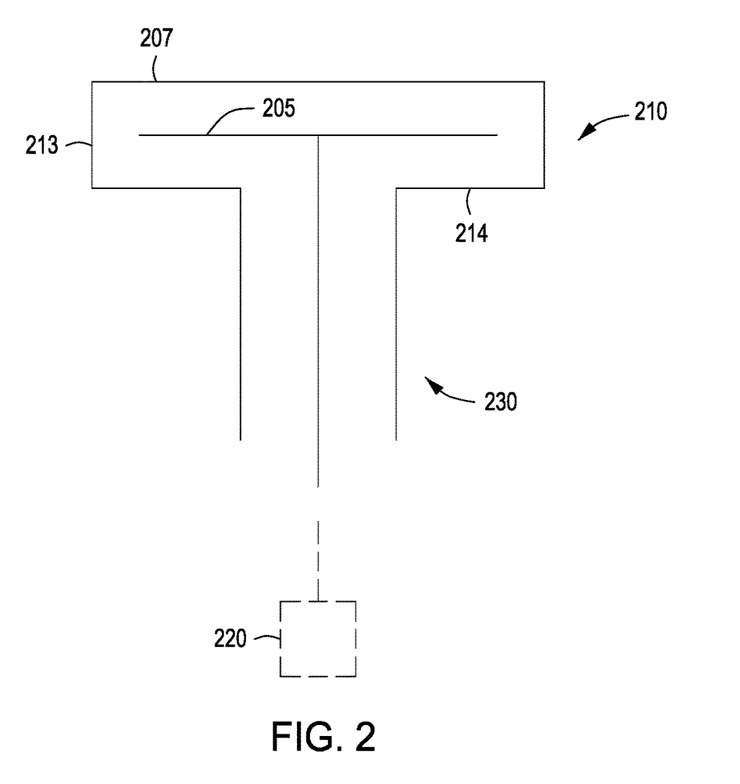
FIG. 2 depicts a substrate processing system in which embodiments in accordance with the present principles can be applied.

As feature sizes continue to diminish and the aspect ratio increases, while feature profile control requirements get more stringent, it becomes more desirable to have a well-controlled IEDF at the substrate surface during processing. A single-peak IEDF can be used to construct any IEDF, including a two-peak IEDF with independently controlled peak heights and energies, which is very beneficial for high-precision plasma processing. Creating a single-peak IEDF requires having a nearly-constant voltage at the substrate surface with respect to plasma, i.e. the sheath voltage, which determines the ion energy. Assuming time-constant plasma potential (which is typically close to zero or a ground potential in processing plasmas), this requires maintaining a nearly constant voltage at the substrate with respect to ground, i.e. substrate voltage. This cannot be accomplished by simply applying a DC voltage to the power electrode, because of the ion current constantly charging the substrate surface. As a result, all of the applied DC voltage would drop across the substrate and the ceramic portion of the ESC (i.e., chuck capacitance) instead of the plasma sheath (i.e., sheath capacitance). To overcome this, a special shaped-pulse bias scheme has been developed that results in the applied voltage being divided between the chuck and the sheath capacitances (we neglect the voltage drop across the substrate, as its capacitance is usually much larger than the sheath capacitance). This scheme provides compensation for the ion current, allowing for the sheath voltage and the substrate voltage to remain constant for up to 90% of each bias voltage cycle. More accurately, this biasing scheme allows maintaining a specific substrate voltage waveform, which can be described as a periodic series of short positive pulses on top of the negative dc-offset (FIG. 1(b)). During each pulse, the substrate potential reaches the plasma potential and the sheath briefly collapses, but for ~90% of each cycle the sheath voltage remains constant and equal to the negative voltage jump at the end of each pulse, which thus determines the mean ion energy. FIG. 1(a) depicts a plot of a special shaped-pulse bias voltage waveform developed to create this specific substrate voltage waveform, and thus enable keeping the sheath voltage nearly constant. As depicted in FIG. 2, the shaped-pulse bias waveform includes: (1) a positive jump to remove the extra charge accumulated on the chuck capacitance during the compensation phase; (2) a negative jump ($V_{OUT}$) to set the value of the sheath voltage ($V_{SH}$)—namely, $V_{OUT}$ gets divided between the chuck and sheath capacitors connected in series, and thus determines (but is generally larger than) the negative jump in the substrate voltage waveform; and (3) a negative voltage ramp to compensate for ion current and keep the sheath voltage constant during this long "ion current compensation phase". We emphasize that there can be other shaped-pulse bias waveforms that also allow maintaining a specific substrate voltage waveform shown in FIG. 1(b) (characterized by the nearly constant sheath voltage), and are hence capable of producing a mono-energetic IEDF. For example, if the electrostatic chuck capacitance is much larger than the sheath capacitance, the negative voltage ramp phase described in (3) above can be substituted with a constant voltage phase. Some of the systems and methods proposed below can also be implemented with these other shaped-pulse bias waveforms, and we will be making a special note of that wherever applicable.

While a single-peak IEDF is widely considered to be a highly desirable shape of IEDF resulting in improved selectivity and feature profile, in some etch applications an IEDF having a different shape, such as a wider shaped IEDF, is required.

SUMMARY

Systems and methods for creating arbitrarily-shaped ion energy distribution functions using shaped-pulse bias are provided herein.

In some embodiments, a method includes applying a shaped pulse bias to an electrode of a process chamber and modulating the amplitude of the negative voltage jump ($V_{OUT}$), and hence the sheath voltage ($V_{SH}$), in a predetermined manner, such that the relative number of pulses at a specific amplitude determines the relative ion fraction at the ion energy, corresponding to this amplitude. We emphasize that this scheme can be implemented with any shaped-pulsed bias waveforms (not necessarily the one shown in FIG. 1(a) that allow maintaining a specific substrate voltage waveform shown in FIG. 1(b) (characterized by the nearly constant sheath voltage), and are hence capable of producing a mono-energetic IEDF.

In some other embodiments, a method includes applying a shaped pulse bias with the voltage waveform shown in FIG. 1(a), and creating a voltage ramp during ion compensation phase that has a more negative slope (dV/dt) than is required to maintain a constant substrate voltage, i.e. overcompensating for the ion current. In some other embodiments, a method includes applying a shaped pulse bias with the voltage waveform shown in FIG. 1(a), and creating a voltage ramp during ion compensation phase that has a less negative slope (dV/dt) than is required to maintain a constant substrate voltage, i.e. undercompensating for the ion current.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Systems and methods for creating arbitrarily-shaped ion energy distribution functions using shaped-pulse—bias are provided herein. The inventive systems and methods advantageously facilitate the creation of arbitrarily-shaped ion energy distribution function (IEDF) by modulating an amplitude of a shaped-pulse bias waveform. Embodiments of the inventive methods can advantageously provide shaping of the voltage waveform to provide arbitrary IEDF shapes, for example, an IEDF with a wider profile. In the description herein the terms wafer and substrate are used interchangeably.

FIG. 2 depicts a high level schematic diagram of a substrate processing system 200 in which embodiments in accordance with the present principles can be applied. The substrate processing system 200 of FIG. 2 illustratively includes a substrate support assembly 205, and a bias supply 230. In the embodiment of FIG. 2, the substrate support assembly 205 includes a substrate support pedestal 210, a power electrode 213 and a layer of ceramic 214 separating the power electrode 213 from a surface 207 of the substrate support assembly 205. In various embodiments, the system 200 of FIG. 2 can comprise components of a plasma processing chamber such as the SYM3®, DPS®, ENABLER®, ADVANTEDGE™ and AVATAR™ process chambers available from Applied Materials, Inc. of Santa Clara, Calif. or other process chambers.

In some embodiments, the bias supply 230 includes a memory for storing control programs and a processor for executing the control programs to control the voltage to be provided by the bias supply 230 to the power electrode 213 and at least modulate an amplitude of a wafer voltage to produce a predetermined number of pulses and, alternatively or in addition, apply a negative jump voltage to the electrode to set a wafer voltage for the wafer or apply a ramp voltage to the electrode that overcompensates or undercompensates for ion current on the wafer in accordance with embodiments of the present principles described herein. In alternate embodiments, the substrate processing system 200 of FIG. 2 can include an optional controller 220 including a memory for storing control programs and a processor for executing the control programs for communicating with the bias supply 230 for at least controlling the voltage to be provided by the bias supply 230 to the power electrode 213 and to at least modulate an amplitude of a wafer voltage to produce a predetermined number of pulses and, alternatively or in addition, apply a negative jump voltage to the electrode to set a wafer voltage for the wafer or apply a ramp voltage to the electrode that overcompensates or undercompensates for ion current on the wafer in accordance with embodiments of the present principles described herein.

In operation, a substrate to be processed is positioned on a surface of the substrate support pedestal 210. In the system 200 of FIG. 2, a voltage (shaped pulse bias) from the bias supply 230 is supplied to the power electrode 213. Nonlinear, diode-like nature of the plasma sheath results in rectification of the applied RF field, such that a direct-current (DC) voltage drop, or "self-bias", appears between the cathode and the plasma. This voltage drop determines the average energy of the plasma ions accelerated towards the cathode. Ion directionality and the feature profile are controlled by the Ion Energy Distribution Function (IEDF). The bias supply 230 can supply a special shaped pulse bias to the power electrode 213 in accordance with embodiments of the present principles described herein. This biasing scheme allows maintaining a specific substrate voltage waveform, which can be described as a periodic series of short positive pulses on top of the negative dc-offset (FIG. 1(b)). During each pulse, the substrate potential reaches the plasma potential and the sheath briefly collapses, but for ~90% of each cycle the sheath voltage remains constant and equal to the negative voltage jump at the end of each pulse, which thus determines the mean ion energy.

Referring back to FIG. 1(a), the amplitude of the shaped-pulse bias signal, and hence the wafer voltage is represented by $V_{out}$. The inventors determined that, in at least some embodiments in accordance with the present principles, the shape of the IEDF can be controlled by modulating the amplitude and frequency of the shaped-pulse bias signal. This method includes applying a shaped pulse bias to an electrode of a process chamber and modulating the amplitude of the negative voltage jump ($V_{OUT}$), and hence the sheath voltage ($V_{SH}$), in a predetermined manner, such that the relative number of pulses at a specific amplitude determines the relative ion fraction at the ion energy, corresponding to this amplitude. The number of pulses at each amplitude must be sufficient to account for transition from one sheath voltage to the next, during which the respective ESC charge is established. The burst comprising the trains of pulses with given amplitudes (FIG. 3) is then repeated over and over for the duration of the process step. Active bursts (on-phases) can be interleaved with periods of silence (off-phases). The duration of each on-phase relative to the total duration of the burst (on and off phases combined) is determined by the duty cycle, and the total duration of the burst (period) is equal to the inverse of the burst frequency. Alternatively, each burst may be composed of a series of pulses with a given (and the same) amplitude, and the train of bursts with different amplitudes is then used to define an IEDF. The relative number of bursts (in a train) with a given amplitude determines the relative portion of ions at a specific energy, and the negative jump amplitude ($V_{OUT}$) of the pulses in these bursts determines the ion energy. The predefined train of bursts is then repeated over and over for the duration of the recipe step. For example, to create a two-peak IEDF with 25% ions contained in the low-energy peak, and 75% of ions contained in the high-energy peak, the train of bursts needs to be composed of 3 bursts of pulses with the negative jump amplitude corresponding to the high ion energy and 1 burst of pulses with the amplitude corresponding to the low ion energy. Such train may be designated as "HHHL". In turn, to create an IEDF with 3 energy peaks of equal height—high (H), mid (M), and low (L)—the train of 3 bursts with different amplitudes corresponding to H, M and L ion energies is required, and may be designated as "HML". A single-peak IEDF is produced by a train composed of a single burst (with both on and off phases) of pulses with a predefined negative jump amplitude. We emphasize that this scheme can be implemented with any shaped-pulsed bias waveforms (not necessarily the one shown in FIG. 1(a)) that allow maintaining a specific substrate voltage waveform shown in FIG. 1(b) (characterized by the nearly constant sheath voltage), and are hence capable of producing a mono-energetic IEDF.

Figure 3:
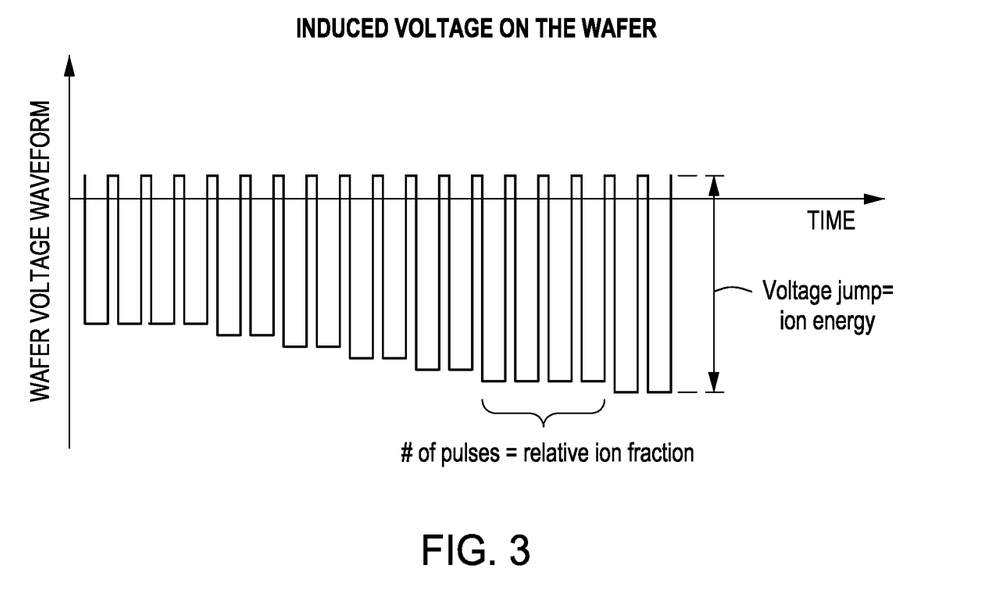
FIG. 3 depicts a plot of voltage pulses to set a value of substrate voltage in accordance with an embodiment of the present principles.

For example, FIG. 3 depicts a plot of voltage pulses to be supplied by a power supply to an electrode of a processing chamber to set a value of substrate voltage in accordance with an embodiment of the present principles. In the embodiment of FIG. 3, the full jump of the wafer voltage determines the ion energy, whereas the number of pulses (e.g., the total time duration) corresponding to the voltage jump determines the relative ion fraction at this energy (i.e., the IEDF).

Figure 4:
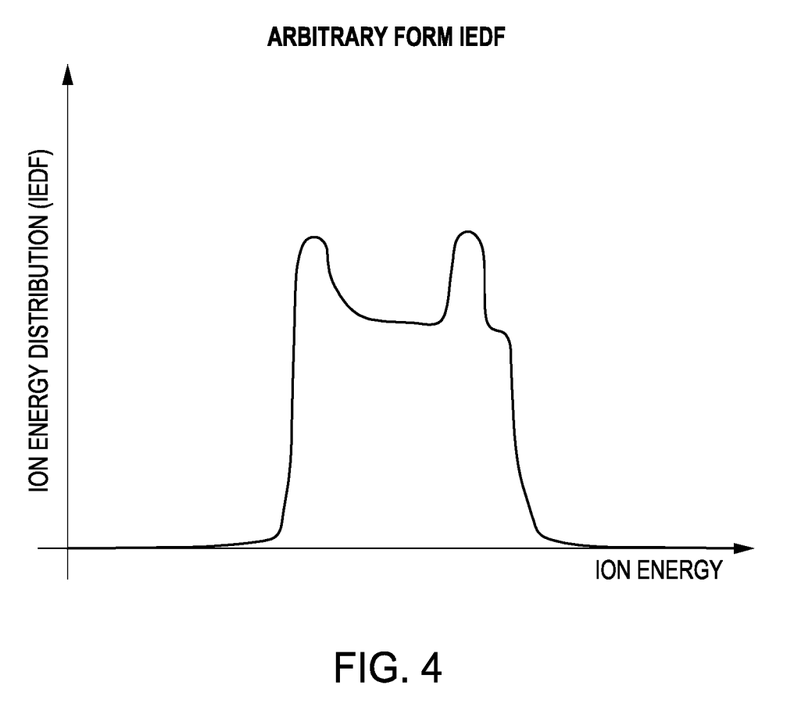
FIG. 4 depicts a graphical representation of a resulting IEDF for the selected voltage pulses of FIG. 3 in accordance with an embodiment of the present principles

FIG. 4 depicts a graphical representation of a resulting IEDF for the selected voltage pulses of FIG. 3 in accordance with an embodiment of the present principles. As depicted in FIG. 4, the multiple voltage pulses of FIG. 3 result in a wider IEDF, which can be advantageous in such applications as hard-mask open high-aspect ratio etch, which require wider ion energy distribution.

The control of the amplitude and frequency of the voltage pulses supplied by a power supply to an electrode of a processing chamber in accordance with the present principles is able to provide a well-controlled and well-defined IEDF shape required by a particular etch process and application.

Figure 5:
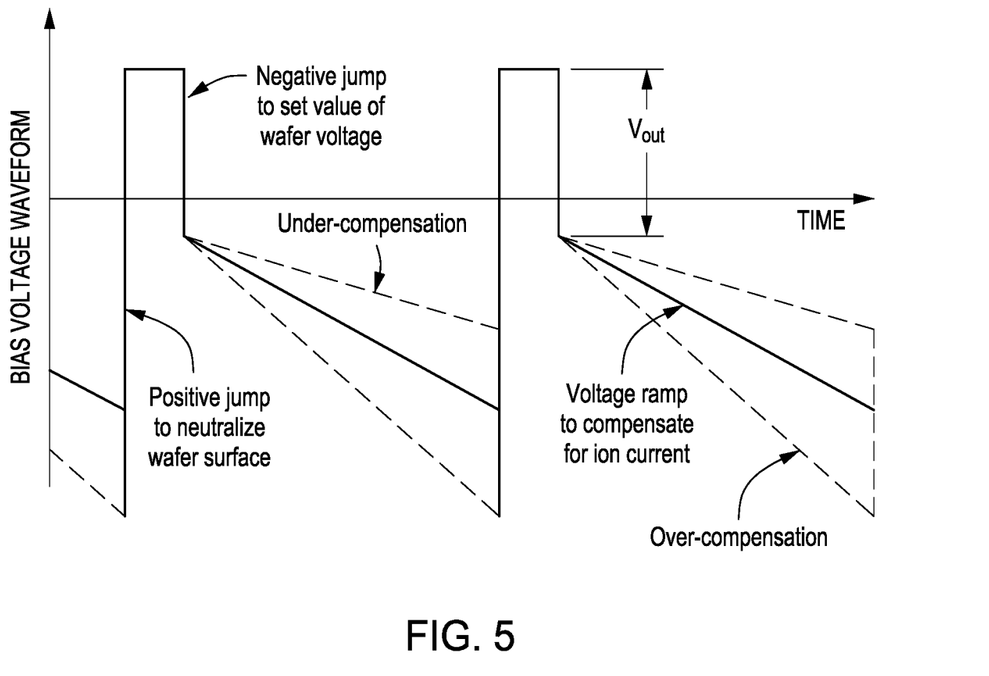
FIG. 5 depicts a plot of the special shaped-pulse of FIG. 1 modified to overcompensate and undercompensate for ion current in accordance with embodiments of the present principles.

In another embodiment in accordance with the present principles, a method includes applying a shaped pulse bias with the voltage waveform shown in FIG. 1(a), and creating a voltage ramp during ion compensation phase that has a more negative slope (dV/dt) than is required to maintain a constant substrate voltage, i.e. overcompensating for the ion current. This results in a substrate voltage waveform shown in FIG. 6 where the magnitude of the substrate voltage (and hence sheath voltage and instantaneous ion energy) increases during the ion current compensation phase. This creates ion energy spread and a non-monoenergetic IEDF shown in FIG. 7 with IEDF width controlled by the negative slope of the applied shape-pulse bias waveform. For example, FIG. 5 depicts a plot of the special shaped-pulse of FIG. 1(a) modified to overcompensate for ion current that charges the wafer in accordance with an embodiment of the present principles. As depicted in FIG. 5, the voltage ramp of FIG. 1(a) intended to compensate for ion current that charges the wafer is modified in the special shaped-pulse of FIG. 5 of the present principles to overcompensate for the ion current that charges the wafer. As depicted in FIG. 5, the positive jump of FIG. 1 intended to neutralize the wafer surface, no longer neutralizes the wafer surface in the special shaped-pulse of FIG. 5 of the present principles.

Figure 6:
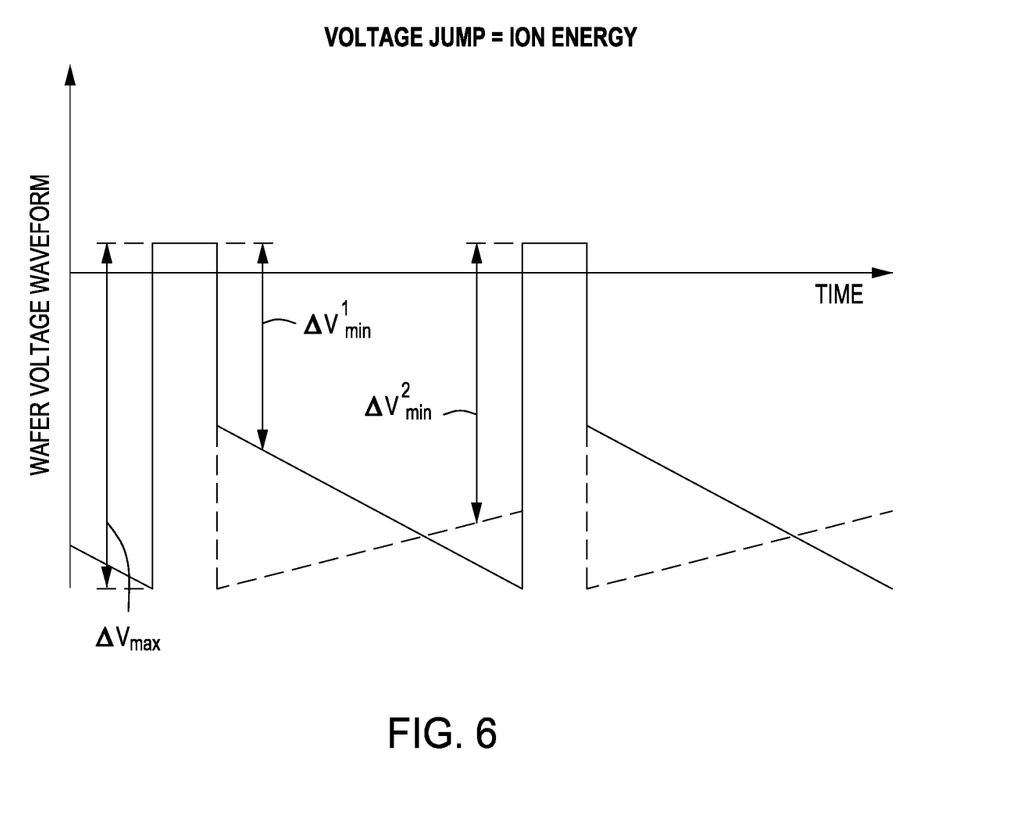
FIG. 6, depicts a plot of induced voltage pulses on the wafer resulting from the special shaped-pulse bias of FIG. 5.

FIG. 6, depicts a plot of induced voltage pulses on the wafer resulting from the special shaped-pulse of FIG. 5. As depicted in FIG. 6, the voltage jump determines the ion energy and the energy width is determined by minimum and maximum wafer voltage jumps during the cycle.

Figure 7:
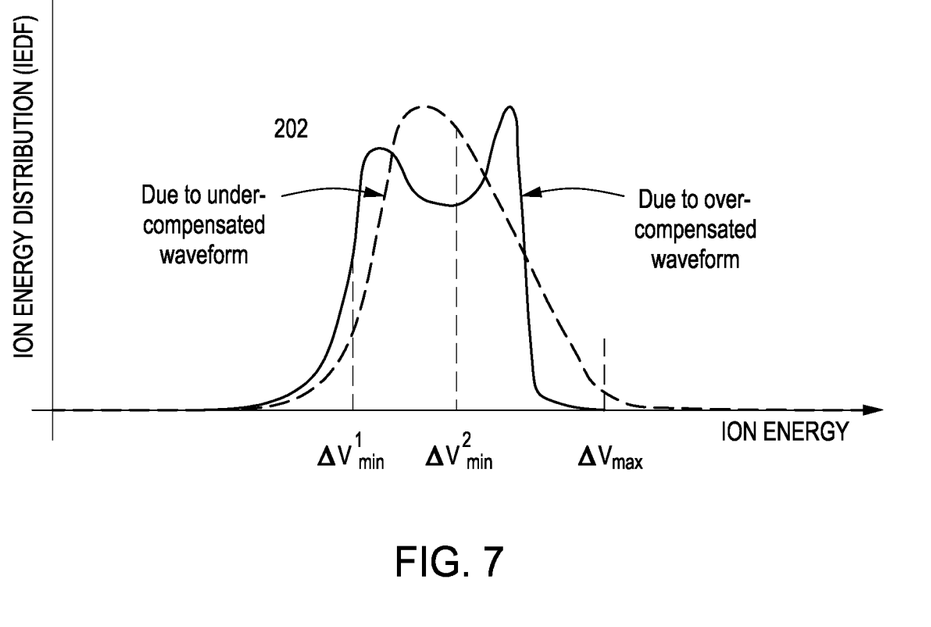
FIG. 7 depicts a graphical representation of a resulting IEDF for the voltage pulses of FIG. 6 in accordance with an embodiment of the present principles.

FIG. 7 depicts a graphical representation of a resulting IEDF for the voltage pulses of FIG. 6 in accordance with an embodiment of the present principles. As depicted in FIG. 7, the IEDF resulting from the application of the overcompensated special shaped-pulse of FIG. 5 includes a wider, double-peaked profile in which $V_{min}$ and $V_{max}$ determine the IEDF width however do not necessarily coincide with the energy peaks. The overcompensation in accordance with the present principles enables a higher precision of control than can be achieved by mixing 2 RF frequencies (e.g. 2 and 13.56 MHz).

In another embodiment in accordance with the present principles, a method includes applying a shaped pulse bias with the voltage waveform shown in FIG. 1(a), and creating a voltage ramp during ion compensation phase that has a less negative slope (dV/dt) than is required to maintain a constant substrate voltage, i.e. undercompensating for the ion current. This results in a substrate voltage waveform shown in FIG. 6 where the magnitude of the substrate voltage (and hence sheath voltage and instantaneous ion energy) decreases during the ion current compensation phase. This creates ion energy spread and a non-monoenergetic IEDF shown in FIG. 7 with IEDF width controlled by the negative slope of the applied shape-pulse bias waveform. For example, referring back to FIG. 5, FIG. 5 depicts a plot of the special shaped-pulse of FIG. 1 modified to undercompensate for ion current that charges the wafer in accordance with an embodiment of the present principles. As depicted in FIG. 5, the voltage ramp of FIG. 1 intended to compensate for ion current that charges the wafer is modified in the special shaped-pulse of FIG. 5 of the present principles to undercompensate for the ion current that charges the wafer. As depicted in FIG. 5, the positive jump of FIG. 1 intended to neutralize the wafer surface, no longer neutralizes the wafer surface in the special shaped-pulse of FIG. 5 of the present principles.

Referring back to FIG. 7, a graphical representation of a resulting IEDF for the undercompensating of an embodiment of the present principles is depicted. As depicted in FIG. 7, the IEDF resulting from the application of the undercompensated special shaped-pulse of FIG. 5 includes a wider, single-peaked profile.

Figure 8:
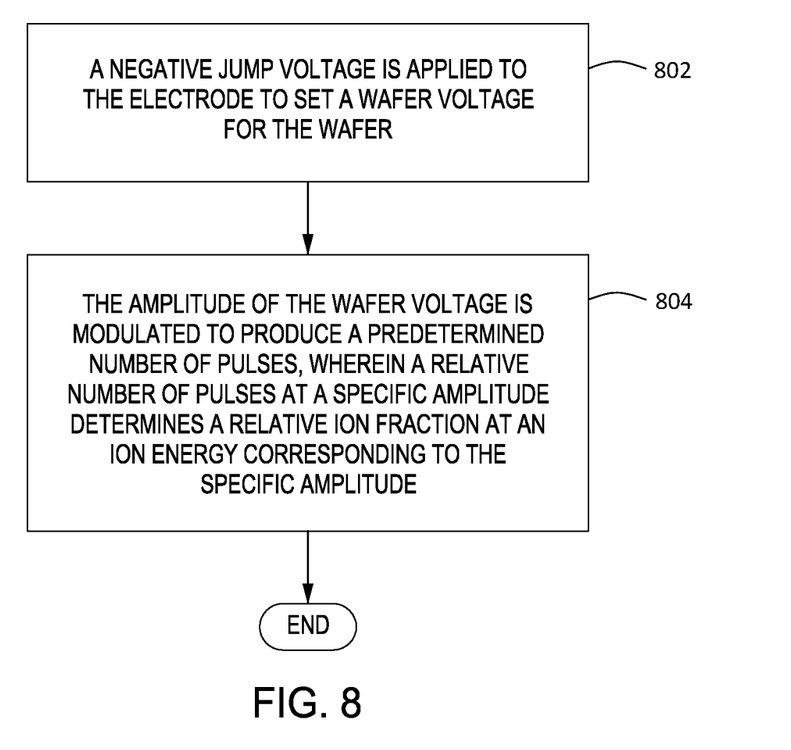
FIG. 8 depicts a flow diagram of a method for the creation of an arbitrarily-shaped ion energy distribution function in accordance with an embodiment of the present principles.

FIG. 8 depicts a flow diagram of a method for the creation of an arbitrarily-shaped ion energy distribution function in accordance with an embodiment of the present principles. The method 800 can begin at 802 during which a negative jump voltage is applied to the electrode to set a wafer voltage. The method 800 can then proceed to 804.

At 804, the amplitude of the wafer voltage is modulated to produce a predetermined number of pulses to determine an ion energy distribution function.

The method 800 can then be exited.

Figure 9:
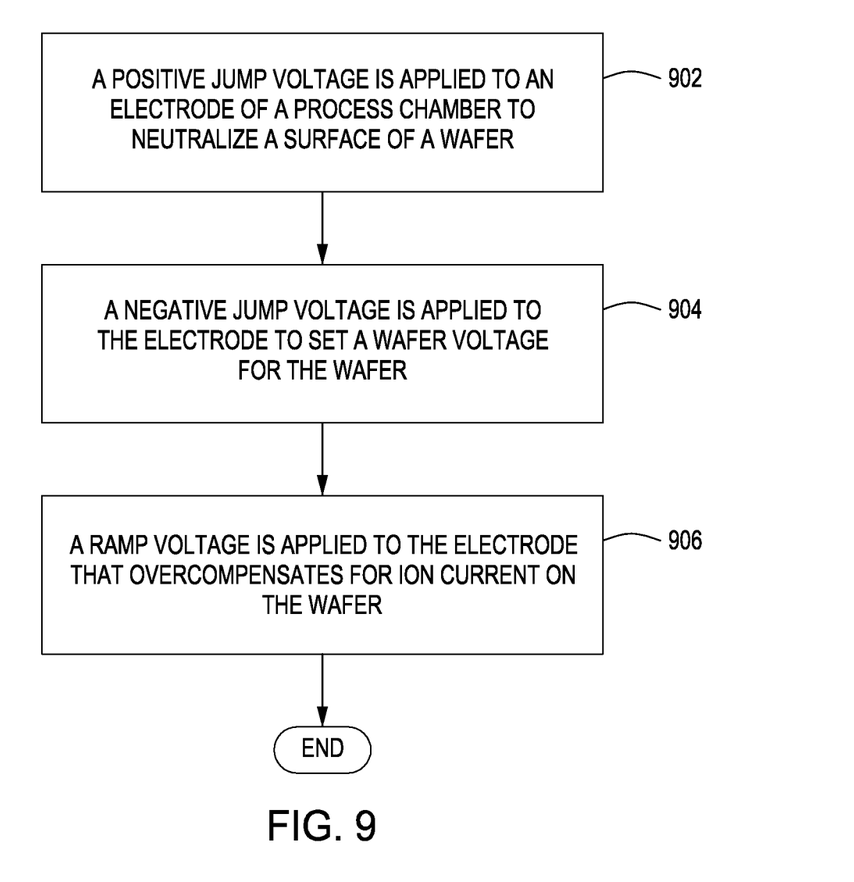
FIG. 9 depicts a flow diagram of a method for the creation of an arbitrarily-shaped ion energy distribution function in accordance with another embodiment of the present principles.

FIG. 9 depicts a flow diagram of a method for the creation of an arbitrarily-shaped ion energy distribution function in accordance with another embodiment of the present principles. The method 900 can begin at 902 during which a positive jump voltage is applied to an electrode of a process chamber to neutralize a wafer surface. The method 900 can then proceed to 904.

At 904, a negative jump voltage is applied to the electrode to set a wafer voltage. The method 900 can then proceed to 906.

At 906, a ramp voltage is applied to the electrode that overcompensates for ion current on the wafer. The method 900 can then be exited.

Figure 10:
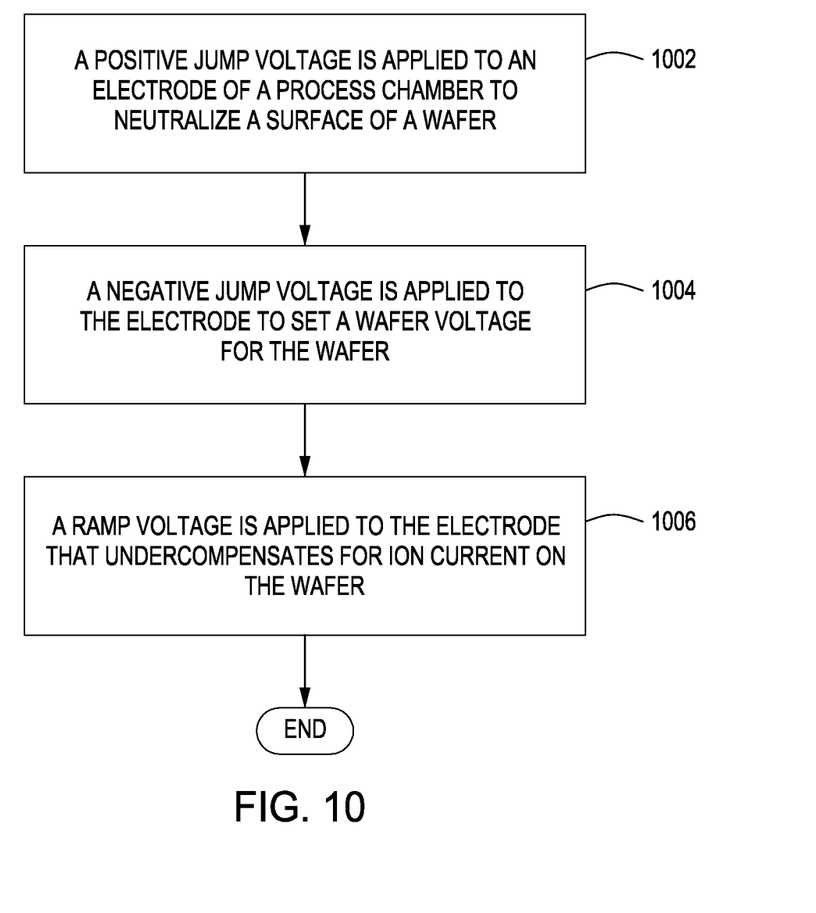
FIG. 10 depicts a flow diagram of a method for the creation of an arbitrarily-shaped ion energy distribution function in accordance with another embodiment of the present principles.

FIG. 10 depicts a flow diagram of a method for the creation of an arbitrarily-shaped ion energy distribution function in accordance with another embodiment of the present principles. The method 1000 can begin at 1002 during which a positive jump voltage is applied to an electrode of a process chamber to neutralize a wafer surface. The method 1000 can then proceed to 1004.

At 1004, a negative jump voltage is applied to the electrode to set a wafer voltage. The method 1000 can then proceed to 1006.

At 1006, a ramp voltage is applied to the electrode that undercompensates for ion current on the wafer. The method 1000 can then be exited.

While the foregoing is directed to embodiments of the present disclosure, other and further embodiments of the disclosure may be devised without departing from the basic scope thereof.

The invention claimed is:

1. A method, comprising:
   (a) delivering a first burst of pulses to an electrode of a process chamber, wherein the first burst of pulses comprises:
     a first plurality of voltage pulses that are delivered during a first burst period, wherein each pulse of the first plurality of voltage pulses comprises a first pulse amplitude; and
   (b) delivering a second burst of pulses to the electrode of the process chamber, wherein the second burst of pulses comprises:
     a second plurality of voltage pulses that are delivered during a second burst period, wherein each pulse of the second plurality of voltage pulses comprises a second pulse amplitude,
   (c) repeating (a) and (b) a plurality of times, wherein repeating (a) and (b) the plurality of times is configured to generate an ion energy distribution function (IEDF) that has a plurality of energy peaks in a plasma formed in the process chamber.

2. The method of claim 1, further comprising a duty cycle that comprises the first burst of pulses provided during the first burst period, the second burst of pulses provided during the second burst period and a period where no voltage pulses are provided to the electrode.

3. The method of claim 1, wherein the first pulse amplitude of the first plurality of voltage pulses is greater than the second pulse amplitude of the second plurality of voltage pulses.

4. The method of claim 3, wherein the first burst period is greater than the second burst period.

5. The method of claim 1, further comprising:
   (d) delivering a third burst of pulses to the electrode of the process chamber, wherein the third burst of pulses comprises:
     a third plurality of voltage pulses that are delivered during a third burst period, wherein each pulse of the third plurality of voltage pulses comprises a third pulse amplitude, and
   wherein:
   repeating (a) and (b) a plurality of times further comprises repeating (a), (b) and (d) a plurality of times, and
   the first pulse amplitude of the first plurality of voltage pulses, the second pulse amplitude of the second plurality of voltage pulses, and the third pulse amplitude of the third plurality of voltage pulses are each different.

6. The method of claim 5, wherein the first pulse amplitude is greater than the second pulse amplitude and the third pulse amplitude, and the second pulse amplitude is greater than the third pulse amplitude.

7. The method of claim 5, wherein the first pulse amplitude is less than the second pulse amplitude, and the second pulse amplitude is less than the third pulse amplitude.

8. The method of claim 1, wherein each pulse of the first plurality of voltage pulses and the second plurality of voltage pulses comprise:
   a negative jump voltage that is applied to the electrode to set a wafer voltage for a wafer; and the wafer voltage formed by applying the first plurality of voltage pulses and the second plurality of voltage pulses creates an ion energy distribution function having two or more energy peaks.

9. The method of claim 8, further comprising applying a positive jump voltage to the electrode of the process chamber prior to applying the negative jump voltage to the electrode, and applying a ramp voltage to the electrode that overcompensates for ion current on the wafer.

10. The method of claim 8, further comprising applying a positive jump voltage to the electrode of the process chamber to neutralize a surface of the wafer.

11. The method of claim 10, wherein the positive jump voltage is applied to the electrode of the process chamber prior to applying the negative jump voltage.

12. The method of claim 1, wherein the generated ion energy distribution function induces a specific bias voltage waveform on a wafer disposed over the electrode.

13. The method of claim 1, wherein an ion fraction for each of the plurality of energy peaks is determined by a number of pulses produced during the first burst period and the second burst period.

14. A method of forming in a plasma an ion energy distribution function (IEDF) that has two or more peaks, the method comprising:
  (a) delivering a first burst of pulses to an electrode of a process chamber, wherein the first burst of pulses comprises:
    a first plurality of voltage pulses that are delivered during a first burst period, wherein each pulse of the first plurality of voltage pulses comprises a first negative jump amplitude; and
  (b) delivering a second burst of pulses to the electrode of the process chamber, wherein the second burst of pulses comprises:
    a second plurality of voltage pulses that are delivered during a second burst period, wherein each pulse of the second plurality of voltage pulses comprises a second negative jump amplitude; and
  (c) repeating (a) and (b) a plurality of times.

15. The method of claim 14, further comprising a duty cycle that comprises the first burst of pulses provided during the first burst period, the second burst of pulses provided during the second burst period and a period where no voltage pulses are provided to the electrode.

16. The method of claim 14, wherein the first negative jump amplitude of the first plurality of voltage pulses is greater than the second negative jump amplitude of the second plurality of voltage pulses.

17. The method of claim 16, wherein the first burst period is greater than the second burst period.

18. The method of claim 14, further comprising:
  (d) delivering a third burst of pulses to the electrode of the process chamber, wherein the third burst of pulses comprises:
    a third plurality of voltage pulses that are delivered during a third burst period, wherein each pulse of the plurality of voltage pulses comprises a third negative jump amplitude,
  wherein:
  repeating (a) and (b) a plurality of times further comprises repeating (a), (b) and (d) a plurality of times, and
  the first negative jump amplitude of the first plurality of voltage pulses, the second negative jump amplitude of the second plurality of voltage pulses, and the third negative jump amplitude of the third plurality of voltage pulses are each different.

19. The method of claim 18, wherein the first negative jump amplitude is greater than the second negative jump amplitude and the third negative jump amplitude, and the second negative jump amplitude is greater than the third negative jump amplitude.

20. The method of claim 18, wherein the first negative jump amplitude is less than the second negative jump amplitude and the third negative jump amplitude, and the second negative jump amplitude is less than the third negative jump amplitude.

21. The method of claim 14, wherein each pulse of the first plurality of voltage pulses and each pulse of the second plurality of voltage pulses comprises applying a positive jump voltage to the electrode of the process chamber prior to applying a negative jump voltage.

* * * * *